PROCESS OF MAKING AN INTAGLIO PLATE USING
AN IMAGE TRANSFER FILM

Filed Dec. 26, 1962

INVENTOR
THOMAS T. BRYAN
BY
Carpenter, Abbott, Coulter & Kinney
ATTORNEYS

United States Patent Office 3,310,403
Patented Mar. 21, 1967

3,310,403

PROCESS OF MAKING AN INTAGLIO PLATE USING AN IMAGE TRANSFER FILM

Thomas T. Bryan, White Bear, Minn., assignor to Minnesota Mining & Manufacturing Company, St. Paul, Minn., a corporation of Delaware Filed Dec. 26, 1962, Ser. No. 247,054
4 Claims. (Cl. 96—28)

Figure 1:
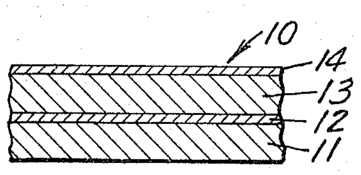

This invention relates to the printing art and, while not restricted thereto, is of particular significance to the preparation of intaglio printing plates or cylinders.

Plates and cylinders employed in gravure printing are commonly prepared by chemical etching of a polished metal surface in a pattern established by a removable stencil or "resist" formed from a photosensitive sheet material by exposure to a desired light-image and development of the resist pattern.

One widely used form of prior art photosensitive sheet material employs as the sensitive layer a coating of bichromated gelatin. The coating is unstable on aging and must be prepared or sensitized shortly before exposure. Prolonged exposure is required because of the low sensitivity of the coating. The sensitive layer is necessarily carried on a water-permeable backing, such as paper, which is dimensionally unstable.

Another form of prior art photosensitive resist sheet employs a sensitive coating of a silver halide photographic emulsion. The coating is applied to water-impermeable film backings or carrier webs. It is relatively stable on aging and requires relatively brief exposure to light. Separation of the carrier web from the exposed emulsion coating prior to chemical etching of the metal printing surface is promoted by the inclusion of a thin intervening stripping layer or membrane which must be separately removed. Such membranes frequently come away from the carrier during storage so that the sheet can no longer be used. Removal of the membrane from the exposed and developed sensitive layer on the plate or cylinder requires solution in organic solvents. The insoluble resist areas of the stencil obtained on exposure and development of such sheets are of essentially uniform thickness so that inflexibility in the exposure and etching processes results. Undercutting is experienced at the sides of the etched areas, reducing the accuracy of reproduction.

The transfer tissue of the present invention effectively overcomes these and other difficulties and deficiencies of prior art products. The photosensitive coating does not lose its sensitivity under normal storage conditions. Brief exposure to the light-image is adequate. The sheet is dimensionally stable and permits accurate register of image. The resist thickness may be varied over wide limits in conformity with the intensity of the light image so that desirable processing flexibility is attained. Removal of the carrier web is accomplished without distortion of, or damage to, the resist image. The intermediate stripping membrane is eliminated, thereby eliminating the need for organic solvents. Of major significance, undercutting during the etching process is diminished or entirely prevented, and close control of the etching process is facilitated.

Figure 2:
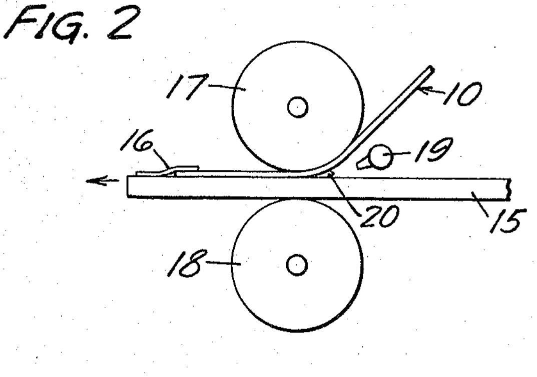
Figure 3:
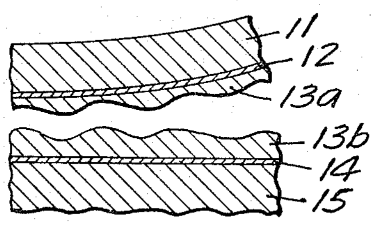
Figure 4:
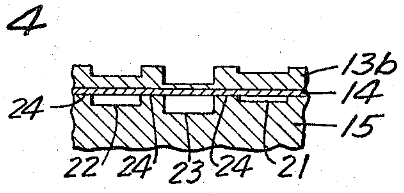
Figure 5:
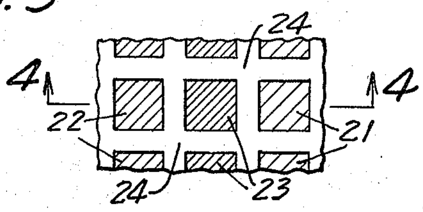

These and other advantages are obtained by employing as the transfer tissue or photosensitive sheet material a structure which for convenience will now be described in terms of an illustrative but non-limiting example, the sheet material and its application being further illustrated in the accompanying drawing in which:

FIGURE 1 represents the transfer sheet in cross-section,

FIGURE 2 schematically represents the application of the imaged transfer sheet to a metal printing plate surface, FIGURE 3 represents in cross-section the separation of residual portions of the sheet from the resist layer on the metal printing plate prior to development and etching, FIGURE 4 represents in cross-section the etching of the plate through the developed resist layer, and FIGURE 5 represents the surface of the plate as seen through the resist layer at completion of the etching process.

The transfer sheet 10 of FIGURE 1 consists of a flexible, dimensionally stable, non-porous film-like base or carrier 11 having an emulsion-receptive surface layer 12, coated with a thick colored photosensitive layer 13 and a thin protective water-activatable adhesive layer 14.

Typically, the flexible carrier comprises a "Mylar" polyester film, nominally five mils (about .13 mm.) in thickness, lightly coated with the in situ crosslinked reaction product of ethylene glycol adipate and toluene diisocyanate. A specific formulation contains a mixture of 100 parts by weight of polyethylene glycol adipate, a compound having a hydroxyl number of 58.5, acid number of 1.5, molecular weight 1880, and which has been dried by heating for 1½ hours under nitrogen at 105° C. and under reduced pressure, with 14.6 parts of 1,5-naphthalene diisocyanate, the mixture being heated for 1½ hours at 95° C., and the product then being mixed with 1.9 parts of 1,4-butanediol; to 100 parts of the resulting solution is then added 30 parts of precipitated calcium carbonate powder, and 19.5 parts of a 75% ethyl acetate solution of a 1:3 molar mixture of trimethylolpropane and toluene diisocyanate. The final mixture is spread uniformly over the polyester film surface at a thickness of 2 mils (.05 mm.), dried for 5 minutes at 300° F., and then cured for 2 hours at 250° F.

"Cronar" film is a commercially available emulsion-receptive subbed polyester film which is likewise a fully effective carrier. Another equally useful commercially available emulsion-receptive carrier or base web is "Plestar" subbed polycarbonate film. Many other film or film-like sheet materials are useful, including cellulose ethers and esters, polystyrene, metal foil, and paper-like fibrous webs. These, like the polyester film, may be coated, impregnated or otherwise treated to provide an emulsion-receptive surface as well as for other purposes.

A noteworthy feature of the invention is that the carrier or base need not be water-pervious, since, as will subsequently be shown, the carrier is separated from the imaged resist layer without any necessity of soaking from the carrier side of the film for promotion of the release action.

The emulsion-receptive carrier is next coated directly, i.e. without the interposition of any removable membrane or release layer, with a photosensitive coating. A photographic emulsion of silver halide in photographic gelatin is first prepared in accordance with well-known techniques, using a relatively high proportion of the silver halide of the order of one gram mol of silver halide to 450 grams of gelatin. The emulsion is then ripened at moderately elevated temperature to obtain optimum photographic properties. Stabilizers, sensitizers, preservatives and the like may be added where desired. To the emulsion there is then added spreading agents, coloring and softening materials; and the resulting coating fluid is applied to the carrier surface in a relatively thick smooth and uniform layer and is dried. It will be appreciated that the photosensitive materials must be handled and maintained under darkroom or safelight conditions.

The concentration of silver halide may vary from about one-third gram molecular weight to about three gram molecular weights for each 450 grams of gelatin, but will preferably be in the upper portion of that range, i.e. at least one gram molecular weight of the silver halide to each 450 grams of gelatin. The thickness of the photosensitive coating similarly may be varied within fairly wide limits of about ten to about fifty thousandths of a millimeter; thicknesses of the dried coating of about 0.020–0.030 mm. are preferred.

A typical coating fluid, in addition to one gram molecular weight of silver halide, 450 grams of photographic gelatin, and stabilizers, sensitizers, and preservatives as desired, contains 3.4 grams of magenta dye, 1.7 grams of yellow dye, 53.5 grams of trimethylolpropane and 8 grams of glycerine in an aqueous vehicle at sufficient dilution to provide a smoothly spreadable composition.

The incorporation of the dyes provides a reddish translucent coating having a color density of approximately 1.0 through a green filter with a transmission maximum at 500 millimicrons. With a blue filter having a transmission maximum at 420 millimicrons, the color density of the film is approximately 1.7. With no filter, the gray density is approximately 0.7. Density ranges under the same conditions may lie within the approximate limits, respectively, 0.5–2.0, 0.5–2.5, and 0.5–2.0, although films having density values approximately as illustrated are preferred. These values may be obtained with either dyes or pigments as desired, provided the same are photographically inert; the specific materials here listed being merely exemplary.

The specific polyhydroxy softener materials likewise represent a preferred proportion and composition, but other materials and other proportions are also effective. Some small amount of humectant plasticizer such as glycerin is desirable as a conditioner to assure a reasonable moisture content in the coating under all normal variations in ambient atmosphere and to improve the permeability of the coating to water; but much larger amounts of this component are to be avoided since they are found to cause excessive and undesirable surface stickiness and softness. In order to attain the desired softness of coating it is therefore found desirable to employ mainly non-hygroscopic water-soluble polyalcohol plasticizers for the gelatin, such as the trimethylolpropane hereinbefore specified; and to incorporate relatively large proportions of the softener materials, for example on the order of one-tenth to one-fifth the weight of the gelatin. Other softeners for gelatin which are also useful alone or in combination with glycerine or trimethylolpropane are ethylene glycol, sorbitol, and mannitol; but the combination of glycerol and trimethylolpropane in the approximate ratio of 1:5 to 1:8 has given excellent results and is presently preferred.

A very thin protective adhesive layer 14 completes the transfer sheet 10 of FIGURE 1. A preferred form of such a layer consists of low gel strength photographic gelatin at a thickness of about .002–.003 mm. The gelatin is conveniently applied as a 5% solution in warm water containing appropriate spreading agents, e.g. one part of saponin for each 100 parts of gelatin.

The transfer sheet, suitably protected from exposure to light, maintains photographic stability to the extent found acceptable in the industry. The sheet may be stored for months or even years without significant deterioration, and is ready for immediate use with no necessity for pre-sensitizing or other pre-treating.

The transfer sheet is particularly useful in the preparation of screen process intaglio printing plates; and its application for such use will now be described.

The sheet is exposed to light through a gray gravure screen and through a continuous-tone positive transparency, preferably in a vacuum back or vacuum frame. It is then developed with a conventional tanning developer, causing tanning or insolubilizing and hardening of the gelatin at the light-struck areas and in proportion to the exposure. More specifically, the exposed sheet is first well soaked in a solution of pyrogallic acid, Metol (p-methylaminophenol sulfate), ascorbic acid, benzotriazole and potassium bromide, and is then placed in an alkaline solution of sodium carbonate and sodium hexametaphosphate to accomplish the developing and tanning action. The sheet is then washed and fixed in a non-hardening fixing bath, after which it may be examined to determine the effectiveness of the exposure. The screen lines should show clearly, being of higher density than the highlights of the tone. The width of the screen lines should be comparable to the dimensions of the original screen; underexposure tends to cause a reduction, overexposure an increase, in line width.

A rough rule of thumb useful in estimating exposures calls for a ratio of exposure times for screen and tone of approximately three to two. The total exposure may also be determined from the developed transfer sheet in terms of developed maximum densities. For conventional monotone gravure, the screen and tone exposure should produce a silver image having an optical density of about 2.6 to 2.8; for hard dot process, a total density of about 2.1 to 2.3 is suitable.

It will be appreciated that for line drawings and the like a single exposure is adequate, the exposure under the gravure screen being unnecessary.

The developed sheet is next treated in a ferricyanide-ferrocyanide bleach solution and again in the non-hardening hyposulfite fixing bath, to remove the silver image and facilitate the subsequent etching process. Bleaching is not essential to the success of the process but is desirable for reasons which will be made apparent. In either case the sheet at this point is washed in water until salt-free.

A final and highly important step in the preparation of the transfer is that of conditioning. For this purpose, the washed and still wet sheet is permitted to soak for about five minutes in a solution containing one part of glycerine or "BPI," a mixture of higher boiling polyalcohols, in five parts of water. It is then permitted to drain and is dried in a current of warm air, after which it is ready to be applied to the smooth polished surface of a printing plate or rotogravure cylinder.

Conditioning is best accomplished in a 1:5 solution as indicated and at a pH of about 4. Concentrations of one part of glycerine in from about five to about 20 parts of water and at pH of about 4 are generally effective, and useful results may be obtained with this or other water-soluble polyalcohols at ratios of about 1:3 to about 1:40 and at pH values of about 3 to about 9. In addition to glycerine, "BPI," a proprietary mixture of higher polyalcohols, is a preferred conditioning material and is particularly effective at concentrations of about 1:6 and at pH values of about 6. Triethylene glycol is equally effective, but at a pH of about 4. Less effective but still useful water-soluble polyalcohol conditioning agents include ethylene glycol, dipropylene glycol, polypropylene glycol, 2-methoxyglycol, "Carbowax" polyglycol, and "Polysolve EE" polyetheralcohol. Control of pH is preferably achieved, where necessary, by buffering with minimal amounts of phthalate buffers; phosphates show a tendency to impair the adhesion of the resist coating to the surface of the copper plate. Control of the pH within the limits indicated is required in order to permit the film to strip freely from the carrier and to prevent hardening and insolubilizing of the unexposed portions of the resist coating. Control of the concentration of polyalcohol in the conditioning solution is likewise required in order to prevent the dried conditioned coating from exhibiting surface stickiness or greasiness while at the same time permitting easy separation and stripping of coating and carrier.

Much of the polyalcohol content of the initial photosensitive coating is removed during the photographic development, bleaching, and washing. It might be expected, therefore, that such materials could be omitted from the coating since they are in any event subsequently removed. It is found, however, that any significant decrease in the polyalcohol content of the coating as initially applied will have the effect of preventing the subsequent effective conditioning of the imaged sheet.

The application of the conditioned and dried sheet to a printing plate is illustrated in FIGURE 2. The sheet 10, after exposure, development, and conditioning as already described, is placed in register on the surface of the copper plate 15 and the leading edge fastened in place, e.g. with a strip of adhesive tape 16. The composite is then passed between wringer rolls 17 and 18, and water is simultaneously applied to the copper from nozzles 19, forming a bead 20 which dampens the gelatin surface of the sheet 10 just before it is pressed against the copper surface. With the materials hereinbefore illustratively specified, movement of the plate and sheet through the rolls at a rate of one foot in ten to 40 seconds provides satisfactory wetting of the sheet and results in effective adhesion between sheet and plate. Too high a speed limits water absorption and prevents subsequent easy removal of the base or carrier, whereas too low a speed permits the gelatin to swell excessively and weakens the bond between sheet and plate.

The plate, with the sheet adhered thereto, is next carefully and uniformly heated, for example in a water bath, whereupon the imaged gelatin layer becomes softened in the unexposed and untanned portions, thus permitting the base or carrier film, together with adhering portions of the gelatin, to be stripped or peeled away as illustrated in FIGURE 3. This procedure is made possible primarily by the extra thickness of the original silver halide-gelatin layer 13 and by the presence of the colorant and softener materials, and the high proportion of silver halide, contained in such layer. The coloring matter in effect masks the innermost strata of the sensitive layer from exposure to light; the extra thickness of the layer imparts additional protection. The high proportion of light-sensitive silver halide makes certain the development of a high degree of tanning at the light-struck areas so that an effective differential may be achieved between tanned and untanned portions. The presence of the high proportion of softener material permits effective softening and splitting of the untanned strata of the gelatin layer under moderate heating. As a result of these several factors, the imaged layer splits within the residual untanned strata. Most of the untanned residue remains with the subbed base 11 as partial layer **13*a* of FIGURE 3; the tanned image portion, together with adhering fragments of untanned gelatin, remains adhered to the copper plate 15 through the adhesive layer 14**.

It should be particularly observed that separation of tanned and untanned strata is accomplished on merely heating the sheet. Heating in a water-bath is convenient and makes possible accurate control of temperature but is not essential since equally effective results may be obtained by heating in a constant-temperature oven. Another noteworthy feature is the absence of any separation film or membrane such as has heretofore invariably been found necessary in film or sheet structures of this type, as evidenced by U.S. Patents Nos. 2,275,617, 2,391,171, 2,993,792 and many others.

After the base has been stripped away, the plate with its adhering layer is soaked in warm water with agitation until all remaining soluble gelatin is removed, leaving the hardened gelatin layer **13*b*** sharply defined as shown in FIGURE 4, at which point a test made by lightly swabbing along a marginal portion of the surface with a pad of wet cotton leaves the cotton essentialy free of color. The plate is then cautiously cooled to room temperature and is dried in preparation for etching.

Surprisingly, the thin intermediate layer 10 of gelatin resists removal during the washing with warm water and remains in place over the entire plate area initially covered, even though initially containing no silver and hence not being subject to tanning during the step of photographic development. Furthermore it will be apparent that any tanning of the protective gelatin layer would decrease or eliminate its ability to form a strong adherent bond to the surface of the copper plate. Nevertheless the gelatin of the thin adhesive layer is not removed by the washing treatment but remains at the plate surface even at those areas at which the gelatin of the inner layer (**13*b* of FIGURE 3) is completely removed. The layer 14** thus remains in place on the copper surface during the subsequent etching step which will now be described.

Etching of the copper is accomplished with aqueous ferric chloride in well-known manner, the etchant preferably being applied as a succession of solutions of decreasing concentration. The solution penetrates the gelatin resist and dissolves the underlying metal, the resulting solution then re-diffusing through the gelatin, leaving the surface of the plate 15 more or less deeply pitted in accordance with the thickness and penetration resistance of the gelatin. Contact of ferric chloride solution with copper produces a dark reddish brown discoloration which is clearly visible through the gelatin and provides a convenient means of detecting the point of maximum depth of etch. The etching process is stopped at the first sign of over-all darkening of the areas corresponding to the screen pattern, indicated in FIGURE 5 as planar-surfaced network areas 24 surrounding the image-forming cavities 21, 22 and 23 of successively increased depth.

Quite unexpectedly, the etchant solutions are found to accomplish little if any undercutting along the edges of the network areas 24, even at portions of the plate corresponding to completely opaque portions of the original transparency. Instead, the etchant penetrates essentially perpendicularly to the planar surface of the plate 15, as illustrated for example at cavity 23 in FIGURE 4. The effect is presumably due, at least in part, to the presence of the retained gelatin layer 14. In any event, undercutting is essentially completely avoided, thus permitting the accurate reproduction of originals of the widest possible tonal values ranging from solid blacks to isolated fine lines and dots.

The surface layer 14 as hereinbefore illustratively described is preferably composed of pure photographic gelatin having a low gel value or gel bloom value preferably between about 100 and 200, the gel having good adhesion to polished copper. Thus, photographic gelatins such as K & K No. 1313A having in water a viscosity at 6% concentration and 40° C. of 6.1 centipoise, a gel bloom of 110, and a pH of 7.5, and Atlantic No. 13228 having a viscosity of 5.7 cp., gel bloom of 160, and pH of 4.3, have both been found acceptable as the adherent protective surface layer. The analytical values are determined in accordance with standard test procedures employed in the testing of photographic gelatins. Other water-soluble adhesive colloid materials, e.g. carboxymethyl cellulose, ammonium caseinate, and methyl cellulose, may be substituted for up to about one-fourth of the gelatin, but best results, at least on polished copper plates, have been obtained with unmodified gelatin and this material is accordingly preferred.

What is claimed is as follows:

1. A process for preparing an intaglio printing plate from which to print reproductions of a graphic original, said process comprising, in order, the steps of:

A. exposing to a light-image of said original and to a screen pattern light-image a photosensitive transfer sheet consisting essentially of, in order,
   (1) a thin flexible emulsion-receptive base,
   (2) a firm non-sticky photosensitive layer having a thickness of about .020–.030 mm. and including, in proportions indicated,
      (a) photographic gelatin—450 grams, (b) silver halide—about one-third to three gram moles, (c) polyalcohol conditioner—about 45 to 90 grams, (d) coloring agents to provide a color density of 0.5–2.0 at 5000 A., of 0.5–2.5 at 4200 A., and a gray density of 0.5–2.0 and (3) a water-permeable colloid adhesive surface layer about 0.002–.003 mm. in thickness;

B. developing the latent silver image with a tanning developer to tan and insolubilize the gelatin in the light-struck areas;

C. bringing the sheet essentially to equilibrium with an aqueous conditioner solution containing one part of water-soluble polyalcohol conditioner in from about 3 to about 40 parts of water and at a pH of between about 3 and about 9, and drying the sheet;

D. moistening the dried coated surface of the sheet to a strongly adherent condition and adhering the said surface to the smooth polished surface of the metal printing plate;

E. warming said plate and attached sheet to soften the untanned inner strata of the imaged layer, and stripably removing said emulsion-receptive base to leave on said metal plate a tanned gelatin resist pattern; and F. chemically etching said plate through said resist pattern.

2. An image transfer film adapted for use in the process defined in claim 1 and comprising, in order:

A. a thin film-like dimensionally stable emulsion-receptive base;

B. a firm non-sticky photosensitive layer about .020–.030 mm. in thickness and including, in the proportions indicated, (1) photographic gelatin—450 grams, (2) silver halide about one-third to three gram moles, (3) polyalcohol conditioner about 45 to 90 grams, and (4) coloring agents to provide a color density of 0.5–2.0 at 5000 A., of 0.5–2.5 at 4200 A., and a gray density of 0.5–2.0; and C. a water-permeable colloid adhesive surface layer about .002–.003 mm. in thickness.

3. An image transfer film adapted for use in the process defined in claim 1 and comprising, in order:

A. a thin polystyrene film having an emulsion-receptive subbing layer;

B. a firm non-sticky photosensitive layer about .020–.030 mm. in thickness and including, in the proportions indicated, (1) photographic gelatin—450 grams, (2) silver halide—about one gram mole, (3) trimethylolpropane—about 53.5 grams, (4) glycerine—about 8 grams, (5) reddish yellow dye—about 5.1 grams, the layer being further characterized as having a color density of about 1.0 at 5000 A. and about 1.7 at 4200 A., and a gray density of about 0.7; and C. a water-permeable colloid adhesive surface layer about .002–.003 mm. in thickness and comprising at least a major portion of photographic gelatin having a gel strength of about 100–200.

4. In a process for preparing an intaglio printing plate from a smooth polished metal plate, the steps of: adhering to said metal plate an imaged unitary transfer film product, said product consisting essentially of a thin film-like dimensionally stable emulsion-receptive base, an outer thin water-permeable water-activatable colloid adhesive surface layer, and an intermediate thick imaged layer comprising tanned and untanned gelatin, the tanned portions each contacting said adhesive layer and forming the image-defining resist pattern, the untanned portions forming at least the entire stratum adjacent said base, the intermediate layer containing water-soluble polyalcohol conditioning agent in amount sufficient to permit softening and separation of said stratum at an elevated temperature and under a peeling force insufficient to cause softening and separation of said tanned portions, said adhering being accomplished by moistening the said colloid adhesive surface layer to a strongly adhesive state and pressing said product with said layer in contact with said plate; heating the composite of plate and film product to a temperature sufficient to soften the said untanned stratum to a separable condition while insufficient to soften said tanned portions to an equivalent condition; and then peeling said emulsion-receptive base, together with any fragments of said untanned portions remaining adhered thereto, from the remainder of said intermediate layer by splitting of the softened heated conditioned untanned gelatin stratum.

References Cited by the Examiner

UNITED STATES PATENTS

| | | | |
|---|---|---|---|
| 306,470 | 10/1884 | Eastman et al. | |
| 2,409,564 | 10/1946 | Heinecke et al. | 96—83 |
| 2,650,877 | 9/1953 | Boyer | 96—83 |
| 2,650,878 | 9/1953 | Boyer | 96—83 |
| 2,725,298 | 11/1955 | Yutzy et al. | 96—28 |
| 2,904,434 | 9/1959 | Milton | 96—83 |

FOREIGN PATENTS

| | | |
|---|---|---|
| 1,124,977 | 3/1962 | Germany. |
| 554,300 | 3/1944 | Great Britain. |
| 559,843 | 3/1944 | Great Britain. |

NORMAN G. TORCHIN, *Primary Examiner.*

J. TRAVIS BROWN, *Examiner.*

A. D. RICCI, *Assistant Examiner.*